(12) United States Patent
Varonen et al.

(10) Patent No.: US 11,476,814 B2
(45) Date of Patent: Oct. 18, 2022

(54) TRANSFORMER BASED SWITCHES AND SYSTEMS FOR PALNA TRANSCEIVERS

(71) Applicant: Teknologian tutkimuskeskus VTT Oy, Espoo (FI)

(72) Inventors: Mikko Varonen, Espoo (FI); Jan Saijets, Tampere (FI); Jan Holmberg, Espoo (FI)

(73) Assignee: Teknologian tukimuskeskus VTT Oy, Espoo (FI)

( * ) Notice: Subject to any disclaimer, the term of this patent is extended or adjusted under 35 U.S.C. 154(b) by 62 days.

(21) Appl. No.: 16/961,664

(22) PCT Filed: Dec. 11, 2018

(86) PCT No.: PCT/FI2018/050903
§ 371 (c)(1),
(2) Date: Jul. 11, 2020

(87) PCT Pub. No.: WO2019/145597
PCT Pub. Date: Aug. 1, 2019

(65) Prior Publication Data
US 2020/0403584 A1    Dec. 24, 2020

(30) Foreign Application Priority Data
Jan. 23, 2018  (FI) .................. 20185060

(51) Int. Cl.
*H03F 3/21*     (2006.01)
*H03F 3/19*     (2006.01)
*H03F 3/45*     (2006.01)

(52) U.S. Cl.
CPC ........... *H03F 3/21* (2013.01); *H03F 3/19* (2013.01); *H03F 3/45475* (2013.01); *H03F 2200/294* (2013.01); *H03F 2200/534* (2013.01); *H03F 2203/45172* (2013.01)

(58) Field of Classification Search
CPC ......... H03F 2200/417; H03F 2200/534; H03F 2200/537; H03F 2200/541
USPC .................. 330/165, 188, 195; 455/78
See application file for complete search history.

(56) References Cited

U.S. PATENT DOCUMENTS

| | | | |
|---|---|---|---|
| 7,869,771 B2 * | 1/2011 | Zolfaghari | H04B 1/0067 455/78 |
| 8,044,540 B2 | 10/2011 | Lee et al. | |
| 9,219,518 B1 | 12/2015 | Chen et al. | |
| 2011/0068636 A1 * | 3/2011 | Lee | H03K 17/693 307/115 |

(Continued)

OTHER PUBLICATIONS

Schmid et al: On the Analysis and Design of Low-Loss Single-Pole Double-Throw W-Band Switches Utilizing Saturated SiGe HBTs. IEEE Transactions on Microwave Theory and Techniques, vol. 62, No. 11, Nov. 2014, pp. 2755-2767.

*Primary Examiner* — Patricia T Nguyen
(74) *Attorney, Agent, or Firm* — Laine IP Oy

(57) ABSTRACT

An improved transformer based switch for PALNA applications. The transformer based switch having an input single pole port and a circuit with at least one transformer and at least one switch configured to connect portions of the transformer to ground or to short the transformer. The primary side of the transformer being connected to the input port and the secondary side of the transformer being connected to an output port.

20 Claims, 7 Drawing Sheets

(56) References Cited

U.S. PATENT DOCUMENTS

| | | | |
|---|---|---|---|
| 2011/0281531 A1* | 11/2011 | Chiang | H04B 1/48 |
| | | | 455/75 |
| 2014/0139298 A1 | 5/2014 | Kim et al. | |
| 2015/0050901 A1* | 2/2015 | Lee | H04B 1/0483 |
| | | | 455/127.3 |
| 2015/0094117 A1* | 4/2015 | Conta | H03F 3/45179 |
| | | | 455/560 |
| 2016/0006475 A1 | 1/2016 | Chen et al. | |
| 2016/0028432 A1 | 1/2016 | Zhang et al. | |
| 2016/0268983 A1* | 9/2016 | Matsuno | H03F 1/565 |
| 2017/0244442 A1 | 8/2017 | Mizokami et al. | |

\* cited by examiner

TRANSFORMER BASED SWITCHES AND SYSTEMS FOR PALNA TRANSCEIVERS

BACKGROUND

Within power amplifier low-noise amplifier (PALNA) applications the power handling capability of a transistor switch can be increased by stacking more devices in series in shunt operation or increasing the periphery in series operation. However both of these options either increase the losses or decrease the isolation of the switch network. Additionally, especially at millimeter-wave frequencies, series switch devices add loss to the signal path in on-state and suffer from capacitive feedthrough in the off state thus decreasing isolation. Therefore, shunt switches are typically utilized at millimeter-wave frequencies. However, current millimeter-wave switches suffer from poor linearity. Currently switch networks are limiting the linearity of MIMIC PALNA systems.

SUMMARY OF THE INVENTION

The present invention provides for improved linearity in a compact switch while also providing low-insertion loss, especially useful for PALNA systems. Within at least some solutions according to the present invention the linearity of the switch is improved by at least 6-dB which is a significant achievement when compared to state-of-the-art. The present invention provides for switches which may be especially useful within millimeter-wave integrated (MIMIC) power amplifier low-noise amplifier (PALNA) systems.

In at least some instances the present invention allows for the quarter-wave power distribution network to be replaced by a transformer based SPST or SPMT switch thus allowing for a decreased footprint and inherent ESD protection.

The invention is defined by the features of the independent claims. Some specific embodiments are defined in the dependent claims.

According to a first aspect of the present invention, there is provided a Single-Pole Single-Throw (SPST) or Single-Pole Multi-Throw (SPMT) transformer based switch configured to be connected to a power amplifier (PA) and/or Low Noise Amplifier (LNA), said transformer based switch comprising:

an input single pole port, and
a circuit comprising:
  a transformer having a primary and secondary winding, wherein one end of the primary winding is connected to the input single pole port and the other end is configured to be connected to a ground potential,
  at least one switch connected at one end to an end of the secondary winding of the transformer, the other end of the at least one switch being either:
    connected to a negative end of the secondary winding, or configured to be connected to a ground potential,
  an output port comprising a first output port connected to one end of the secondary winding of the transformer and a second output port connected to the other end of the secondary winding of the transformer.

EMBODIMENTS

Transformer based switches for PALNA applications according to the present invention provide not only lower insertion loss for both the PA and LNA paths and lower power consumption when the PA path is active. Additionally, the transformer based switches provide for a smaller component than traditional quarter wavelength distribution networks. Furthermore, differential operation as allowed by at least some embodiments of the present invention improves the linearity of the switch and any connected power amplifier.

As discussed above, at least some embodiments of the present invention provide for as much as a 3 dB improvement when compared with power combining techniques previously employed in PALNA applications. Up to a 6 dB improvement is possible within certain embodiments as the transformer provides for a low-impedance load as seen by the PALNA components.

Figure 1A:
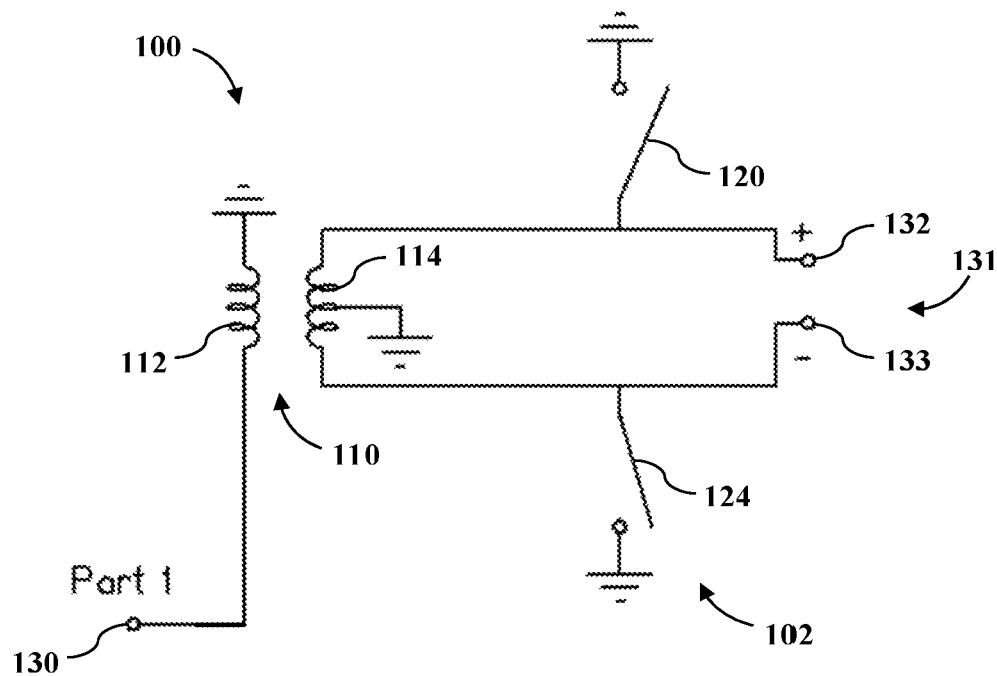
FIGS. 1A and 1B illustrate transformer based switches according to certain embodiments of the present invention.
Figure 1B:
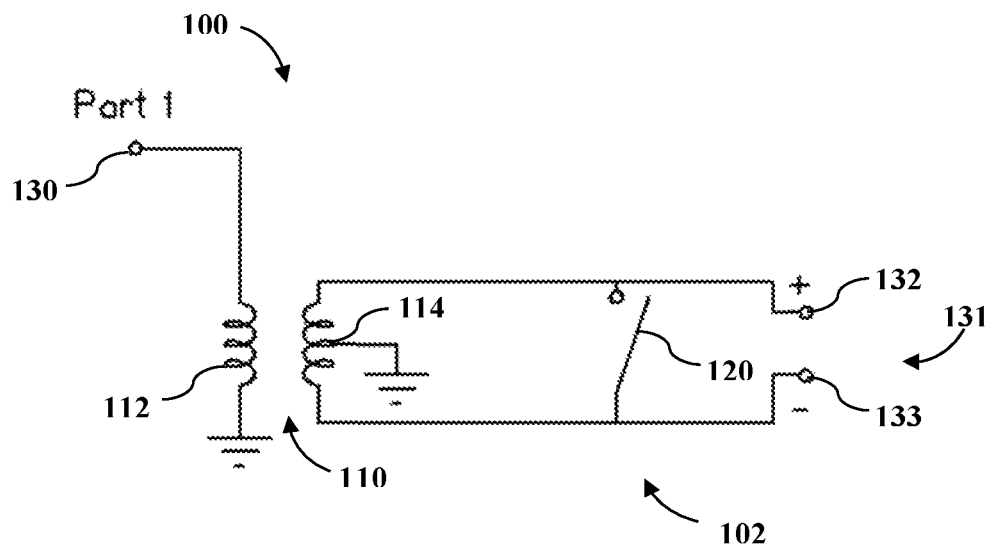

FIGS. 1A and 1B illustrate Single-Pole Multi-Throw (SPMT) and Single-Pole Single-Throw (SPST) transformer based switches 100 respectively. These switches are configured to be connected to a power amplifier (PA) and/or Low Noise Amplifier (LNA). As shown the transformer based switch 100 comprises an input single pole port 130, and a circuit 102. The circuit 102 having a transformer 110, at least one switch 120, 124, and an output port 131. The transformer 110 of FIGS. 1A and 1B has a primary winding 112 and secondary winding 114 winding, wherein one end of the primary winding 112 is connected to the input single pole port 130 and the other end is configured to be connected to a ground potential. As illustrated, at least one end of the switch 120 is connected to an end of the secondary winding 114 of the transformer 110. However, the switch 120 of the circuit may be configured in one of two ways.

As illustrated within FIG. 1B, the other end of the switch 120 may be connected to the other end of the secondary winding 114. Alternatively, as illustrated within FIG. 1A, the other end of the switch 120 may be configured to be connected to a ground potential. Within both alternatives the circuit also has an output port 131 comprising a first output port 132 connected to one end of the secondary winding 114 of the transformer 110 and a second output port 133 connected to the other end of the secondary winding 114 of the transformer.

Within certain embodiments of the transformer based switches according to the present invention the transformer is a linear transformer, preferably a center tap transformer, more preferably a center tap transformer having a center tap configured to be connected to a ground potential, preferably an alternating current (AC) ground potential.

In embodiments of the present invention adapted to provide a transformer based switch for a power amplifier, the impedance transformation allows for easier switch design as well as selection and optimization of the power amplifier. Power transformation as provided by at least some embodiments of the present invention provides for an impedance at the secondary winding of the transformer half that which is provided at the input port.

Figure 2A:
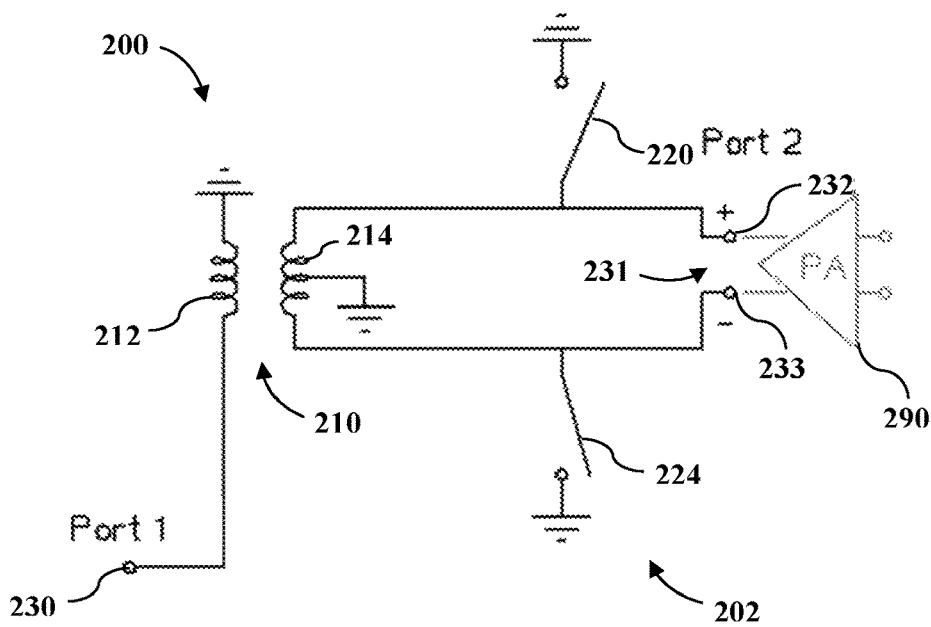
FIG. 2A illustrates a transformer based switch adapted for use with a power amplifier according to an embodiment of the present invention.

As illustrated within FIG. 2A, according to at least some embodiments of the present invention the circuit of the transformer based switch 200 may comprise a PA circuit 202. Within certain embodiments this circuit may be used, for example, within a transmitter circuit, such as a transmitter circuit employing a power amplifier. As within the embodiments illustrated within FIGS. 1A and 1B, once again there is a single pole input port 230, a transformer 210 having primary 212 and secondary 214 windings and an output port 231 having a first output port 232 and a second output port 233. However, within the transformer based switch of FIG. 2A, there at two switches, one acting as a positive port switch 220, and the other as a negative port switch 224. Within at least some embodiments there are additional positive and negative port switches.

Within the embodiment shown in FIG. 2A there is at least one positive port switch 220 connected at one end to a positive end of the secondary winding 214 of the transformer 210, the other end of the switch being configured to be connected to a ground potential. On the opposite side of the circuit there is at least one negative port switch 224 connected at one end to a negative end of the secondary winding 214 of the transformer 210, the other end of the switch being configured to be connected to a ground potential.

As shown within FIG. 2A at least some transformer based switches according to the present invention further comprise a power amplifier 290 connected to the output port.

Figure 2B:
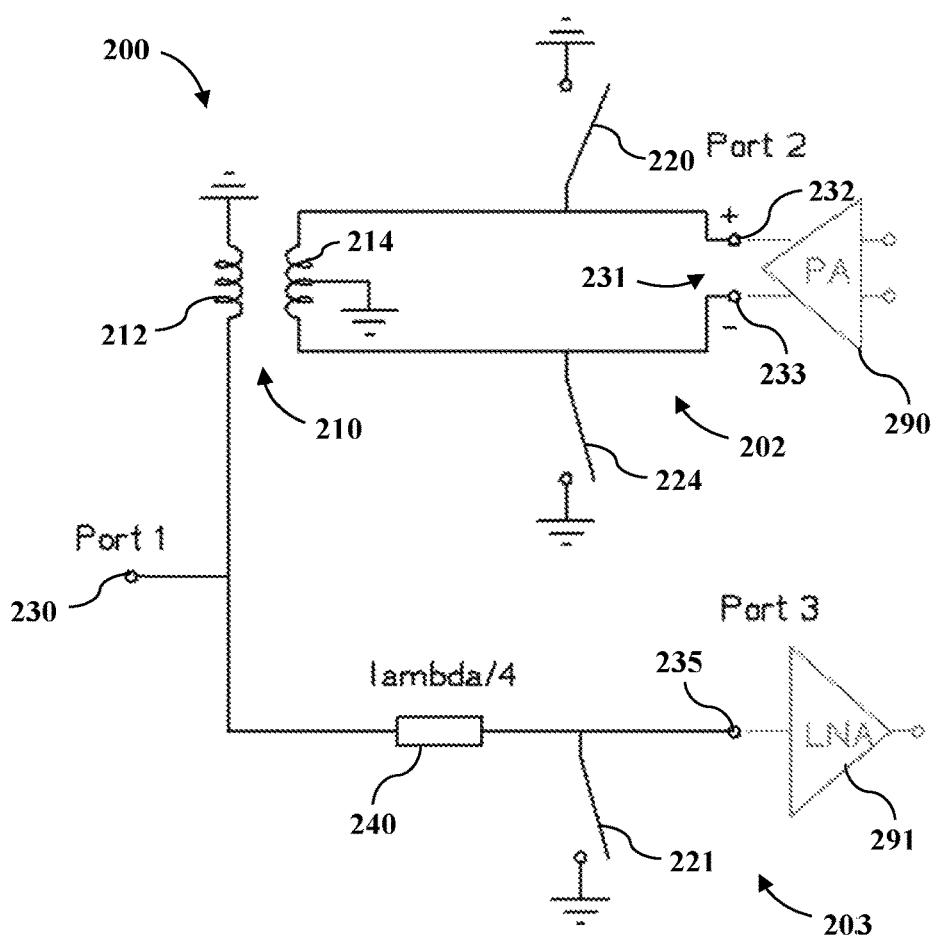
FIG. 2B illustrates a transformer based switch having both a portion adapted for use with a power amplifier and a portion adapted for use with a low noise amplifier according to certain embodiments of the present invention.

FIG. 2B shows the transformer based switch of FIG. 2A further comprising an LNA circuit 203 according to an embodiment of the present invention. The LNA circuit comprises a quarter wavelength impedance 240 connected at one end to the input single pole port 230, an LNA output port 235 connected to the other end of the quarter wavelength impedance 240, and at least one LNA circuit switch 220 connected at one end to the LNA output port 235, the other end being configured to be connected to a ground potential.

As shown within FIG. 2B at least some transformer based switches according to the present invention further comprise a low noise amplifier 291 connected to the LNA output port.

A transformer based switch according to the embodiment of FIG. 2B could find use, for example, in a PALNA transceiver application. Within such an application the PA circuit 202 would act as the transmitter portion and LNA circuit 203 would act as the receiver portion.

Figure 3:
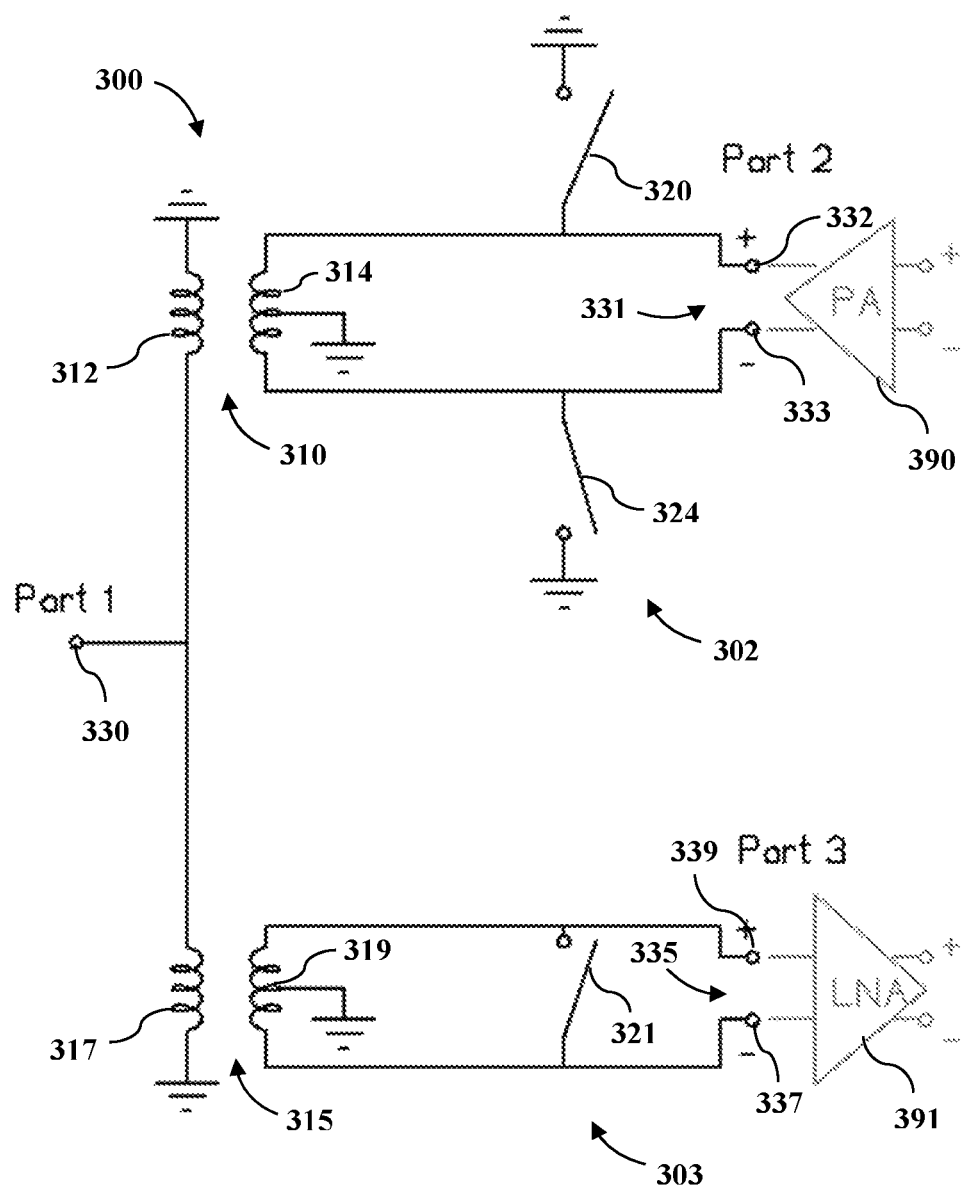
FIG. 3 shows a transformer based switch having two circuits, one adapted for use with a power amplifier and one adapted for use with a low noise amplifier according to at least some embodiments of the present invention.

FIG. 3 illustrates a transformer based switch similar to that of FIG. 2B, only within the embodiment illustrated within FIG. 3; the LNA circuit is slightly more robust. Once again there is a single pole input port 330, a transformer 310 having primary 312 and secondary 314 windings and an output port 331 having a first output port 332 and a second output port 333. As within FIG. 2A, the PA circuit 302 comprises two switches, one acting as a positive port switch 320, and the other as a negative port switch 324. Within at least some embodiments there are additional positive and negative port switches. A power amplifier 390 is illustrated where it would be connected to the PA circuit.

Within FIG. 3 the LNA circuit 303 comprises a second transformer 315 having a primary 317 and secondary 319 winding, wherein one end of the primary winding 317 of the second transformer 315 is connected to the input single pole port 330 and the other end is configured to be connected to a ground potential. The LNA circuit now has an LNA output port 335 comprising a first port 336 connected to one end of the secondary winding 319 of the second transformer 315 and a second port 337 connected to the other end of the secondary winding 319 of the second transformer 315. Finally there is an LNA circuit switch 320 connected at one end to first port 336 of the LNA output port 335 the other end being connected to the second port 337 of the LNA output port 335. Once again a low noise amplifier 391 is illustrated where it would be connected to the output port.

Within at least some transformer based switches according to the present invention the switches can be transistors, for example, bipolar transistors, each transistor having a base connected to a switch port, said switch ports being configured to be connected to a switching potential. At least two embodiments having transistors according to the present invention are illustrated within FIGS. 4A and 4B.

Figure 4A:
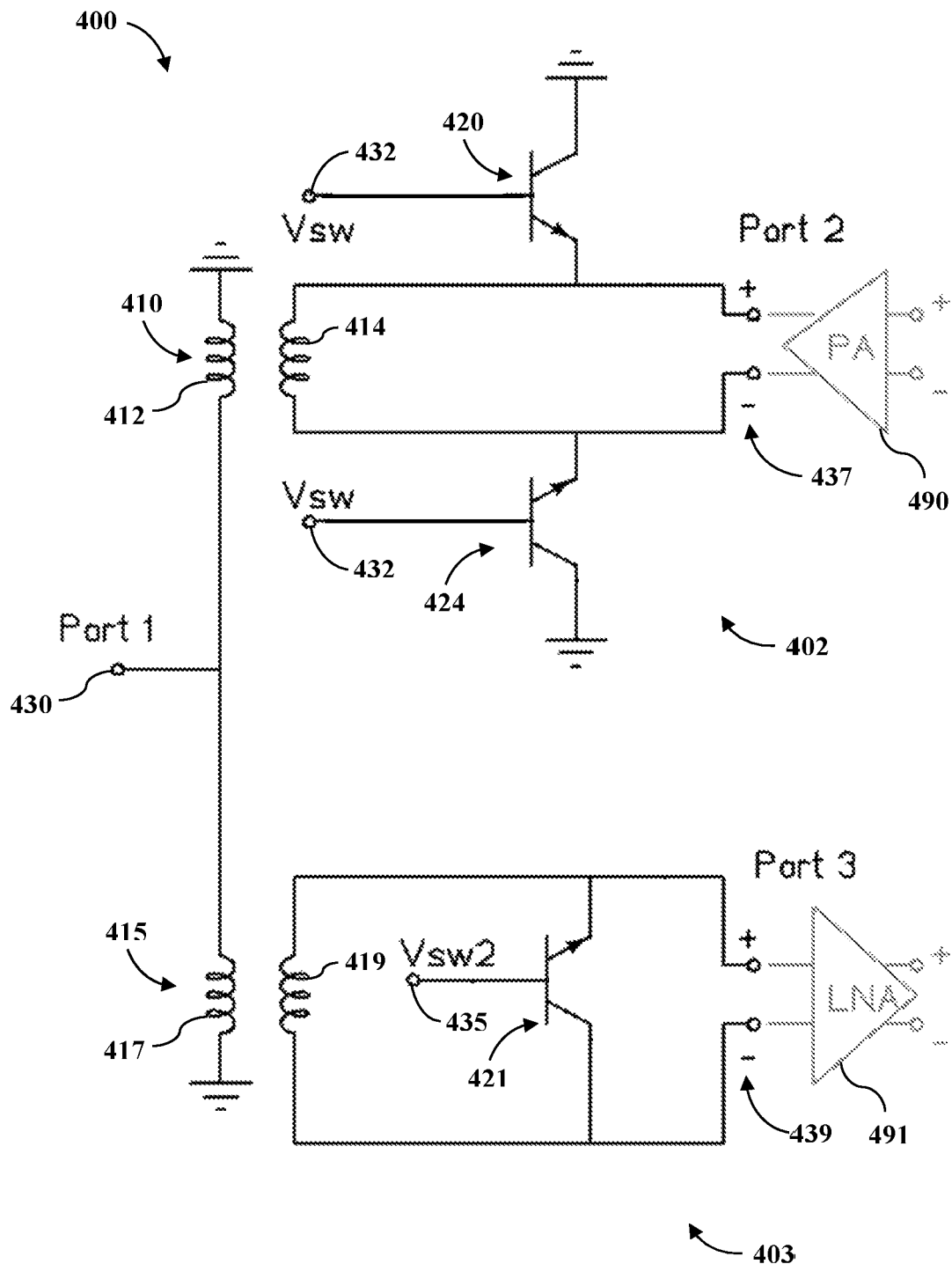
FIG. 4A illustrates a single-pole dual-throw (SPDT) transformer based switch for PALNA applications in accordance with at least some embodiments of the present invention.

FIG. 4A shows a Single-Pole Multi-Throw (SPMT) transformer based switch 400 for use in Power Amplifier and Low Noise Amplifier (PALNA) applications in accordance with at least some embodiments of the present invention. Such a switch may be employed, for example, in a transceiver. As shown, the transformer based switch 400 comprises: an input single pole port 430, a Power Amplifier (PA) circuit 402 and a Low Noise Amplifier (LNA) circuit 403. The PA circuit 402 comprises a first transformer 410, transistors 420, 424 and ports 432, 434, 437. The first transformer 410 of the PA circuit 402 has a primary 412 and secondary 414 winding and as shown the primary winding 412 is connected at one point to the input single pole port 430 and at another point the primary winding 412 is configured to be connected to a ground potential illustrated within the figures as a ground symbol.

There are at least two transistors employed within the PA circuit 402 of the transformer based switch 400, at least one positive port transistor 420 and at least one negative port transistor 424. The at least one positive port transistor 420 is arranged such that its emitter is connected to a positive end of the secondary winding 414 of the first transformer 410, its collector is configured to be connected to a ground potential and its base is connected to a first switch port 432, said first switch port 432 being configured to be connected to a switching potential. The at least one negative port transistor 424 is arranged such that its emitter is connected to a negative end of the secondary winding 414 of the first transformer 410, its collector is configured to be connected to a ground potential and its base is connected to a second switch port 434, said second switch port 434 being configured to be connected to a switching potential.

As also illustrated within FIG. 4A, the PA circuit has a first output port 437 comprising a positive port connected to the positive end of the secondary winding 414 of the first transformer 410 and a negative port connected to the negative end of the secondary winding 414 of the first transformer 410. As shown within FIG. 4A, at least some embodiments of the present invention comprise a power amplifier connected to the first output port 437 of the transformer based switch 400.

Illustrated at the bottom of FIG. 4A is the Low Noise Amplifier (LNA) circuit 403. This LNA circuit 403 comprises a second transformer 415, a transistor 421 and an output port 439. As illustrated the second transformer 415 has a primary 417 and secondary 419 winding. The primary winding 417 of the second transformer 415 is connected at one point to the input single pole port 430 and at another point it is configured to be connected to a ground potential. The transistor 421 of the LNA circuit 403 is configured such that its emitter is connected to a positive end of the secondary winding 419 of the second transformer 415, its collector is connected to a negative end of the secondary winding 419 and its base is connected to a third switch port 435, said third switch port 435 being configured to be connected to a switching potential.

As discussed herein the negative and positive ends of the transformer windings may have a variety of meanings. As illustrated within the figures these ends may be opposing terminal ends of the windings. These negative and positive ends could also refer to locations along a transformer winding divided by taps, for example the negative end could be at a terminal end of the winding and the positive at a tapped location along the winding. For a further example the negative and positive ends could be at two separate tapped locations along the winding. Similarly primary and secondary windings of transformers may sometimes be an arbitrary label and may refer to an entire winding on one side of a transformer or a portion of a winding on one side of a transformer.

As further illustrated, the LNA circuit's 403 output port forms a second output port 439 of the transformer based switch 400. The second output port 439 comprising a positive port connected to the positive end of the secondary winding 419 of the second transformer 415 and a negative port connected to the negative end of the secondary winding 419 of the second transformer 415. As also shown in FIG. 4A, at least some embodiments of the present invention comprise a low noise amplifier 491 connected to the second output port 439 of the transformer based switch 400.

In at least some embodiments of the present invention the first and second switch ports 432, 434 are configured to be connected to the same potential. For example, they may be conductively connected using a trace. In other embodiments the first and second switch port 432, 434 are configured to be connected to different potentials. For example they could be labeled differently and/or conductively isolated on a printed circuit board.

Figure 4B:
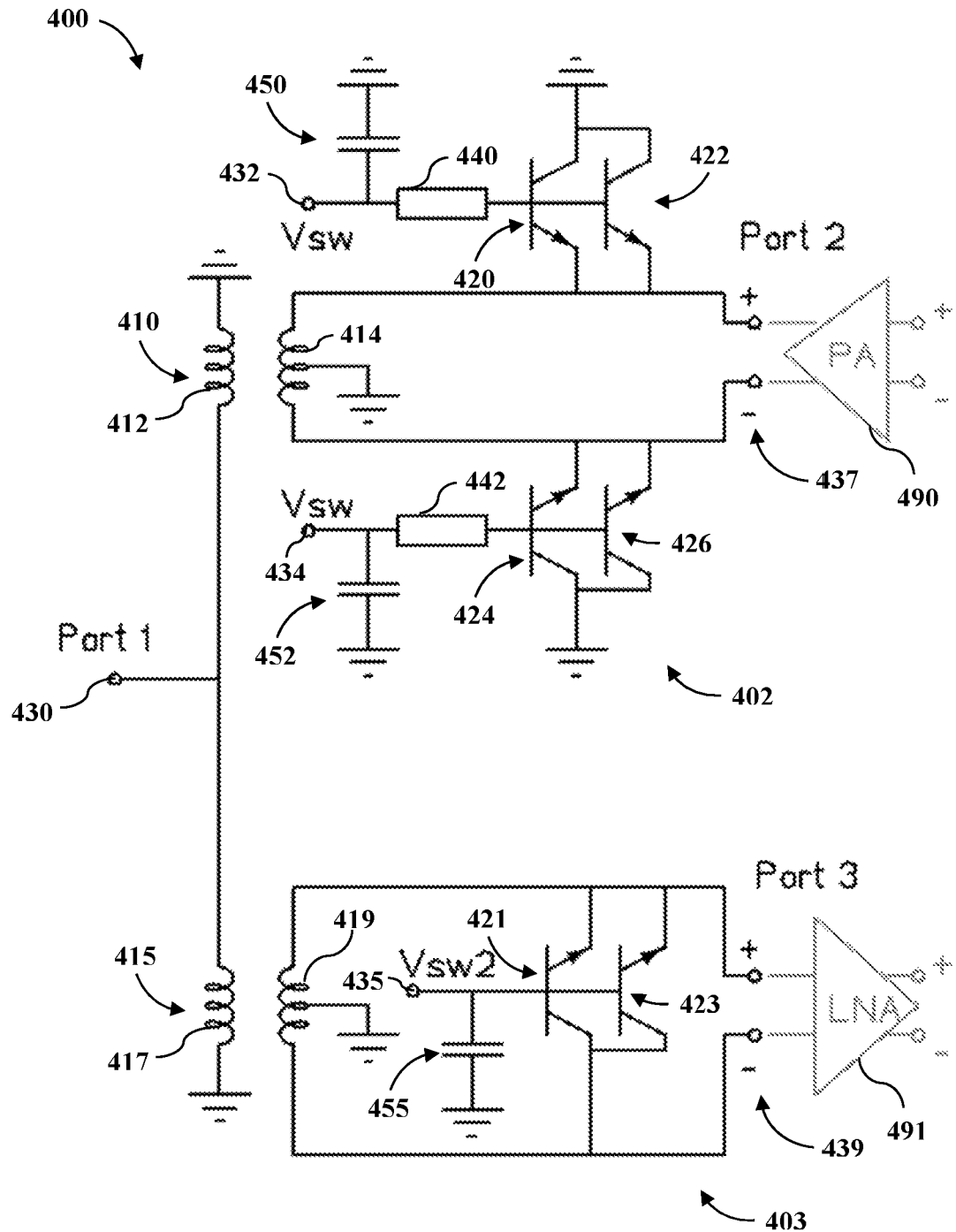
FIG. 4B illustrates the same SPDT transformer based switch having additional features according to certain embodiments of the present invention.

FIG. 4B illustrates the same SPDT transformer based switch 400 as discussed above with regards to FIG. 4A, save for the fact that the switch 400 of FIG. 4B illustrates additional features according to certain embodiments of the present invention. For example, at least some transformer based switches according to the present invention employ impedances 440, 442 connected between the base of transistors and their respective switch ports, preferably impedances which are selected such that they are quarter wavelength impedances. While not illustrated within FIG. 4B, an impedance, such as a quarter wavelength impedance, is also employed between the base of the transistor 421 and switch port 435 of the LNA circuit 403 in at least some embodiments of the present invention.

Certain embodiments employ capacitors 450, 452, 455 configured to be connected between each of the switch ports and a ground potential. Such capacitors are sometimes referred to as DC blocking capacitors.

Within at least some embodiments the transformers 410, 415 are linear transformers. Certain embodiments employ center tap transformers and in some embodiments those center tap transformers have a center tap configured to be connected to a ground potential.

Within at least some embodiments of the present invention the PA and LNA circuits are configured to operate at different frequencies.

Within FIGS. 1 through 4 the outputs are illustrated in a differential fashion, that is, they are designated as positive and negative ports. However, at least some switches according to the present invention may be operated in a non-differential fashion such that each output port is configured to provide an independent output.

As shown previously, in according with at least some embodiments of the present invention, the PA circuit 402 of the transformer based switch 400 of FIGS. 4A and 4B may also be employed independently. This may be useful in situations where only a transmitter is desired or multiple transmitters are a variety of frequencies are desired.

Figure 5:
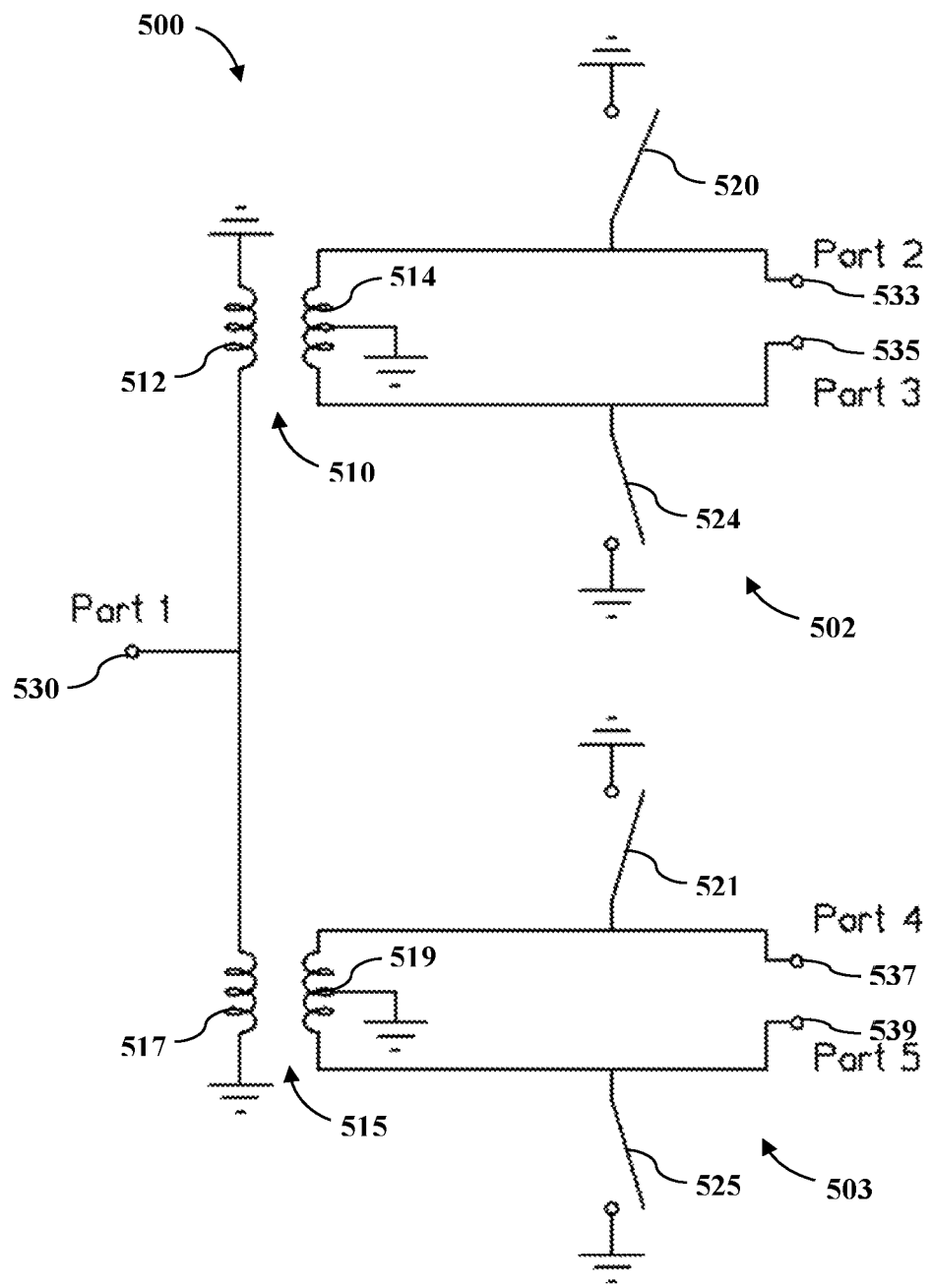
FIG. 5 illustrates a transformer based Single-Pole 4-Throw (SP4T) switch in accordance with at least some embodiments of the present invention.

FIG. 5 illustrates a transformer based Single-Pole 4-Throw (SP4T) switch 500 in accordance with at least some embodiments of the present invention. The transformer based switch of FIG. 5 would find use across a variety of PALNA applications. As illustrated within FIG. 5 there are two substantially identical circuits 502, 503. Each circuit comprises a transformer 512 and 515 having a primary 512, 517 and secondary 514, 519 winding. The primary windings 512, 517 are connected at one end to the single pole input port 530 and are configured to be connected to a ground potential at the other end. The secondary windings 514, 519 are connected at one end to a first output port 533, 537 and at the other to a second output port 535, 539. Connected to each end of the secondary winding 514, 519 is a switch 520, 521, 524, 525 connected at one end to the secondary winding, the other end being configured to be connected to a ground potential.

Figure 6:
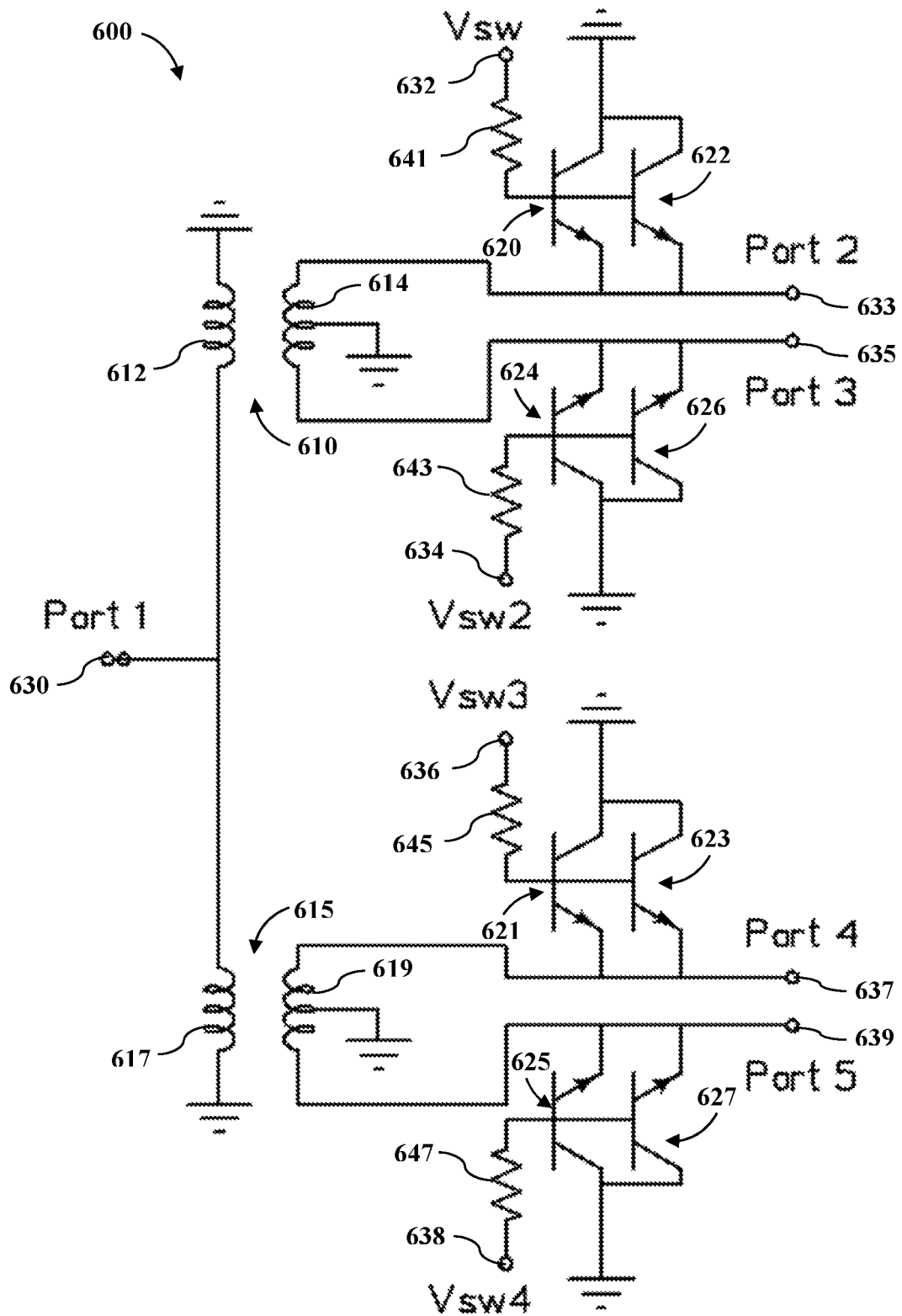
FIG. 6 illustrates a transformer based Single-Pole 4-Throw (SP4T) switch for PALNA applications in accordance with at least some embodiments of the present invention.

FIG. 6 illustrates a transformer based Single-Pole 4-Throw (SP4T) switch 600 for PALNA applications in accordance with at least some embodiments of the present invention. As seen in the figure, two transformer-based SPDT switches (602, 604) are employed to form a SP4T switch. Which may be employed, for example, in a transceiver, such as a transceiver configured to operate on four different frequencies, for instance a cellular phone transceiver.

Once again the transformer based switch 600 comprises a single pole input port 630 connected to windings 612, 617 two transformers 610, 615. Opposite the connection to the input port 630 these windings 612, 617 are grounded. Starting at the secondary windings 614, 619 of each transformer 610, 615 are mirrored SPDT switches 602, 604.

The transformer based switches 602, 604 each comprise a transformer 610, 615, an output port 633, 635 and 637, 639, switch ports 632, 634, 636, 638 and transistors 620-627. Within each of the SPDT switches 602, 604 at least one of the transistors acts as a positive port transistor 620, 621 having: an emitter connected to a positive end of the respective secondary winding 614, 619 of the transformer, a collector configured to be connected to a ground potential and a base connected to a respective first and third switch port 632, 636, said first switch ports 632, 636 being configured to be connected to a switching potential. Additionally each SPDT switch 602, 604 has at least one negative port transistor 624, 625 having: an emitter connected to a negative end of the respective secondary winding 614, 619 of the transformer, a collector configured to be connected to a ground potential and a base connected to a second and fourth switch port 634, 638 respectively, said second and fourth switch ports 634, 638 being configured to be connected to a switching potential.

As further illustrated, each SPDT switch 602, 604 has an output port comprising a positive port 633, 637 connected to the positive end of the respective secondary winding 614, 619 and a negative port 635, 639 connected to the negative end of the respective secondary winding 614, 619.

As shown in FIG. 6, certain embodiments according to the present invention employ resistors 641, 643, 645, 647 at the base of the transistors in place of quarter-wave short circuited stubs.

Certain SP4T transformer based switches according to the present invention employ a pair of parallel transistors per side of the secondary winding. These pairs are illustrated in FIG. 6 as 620 and 622, 624 and 626, 621 and 623, and 625 and 627.

FIGS. 4A, 4B and 6 show embodiments of the present invention wherein the switches are implemented as bipolar junction transistors (BJT); however a variety of different switch implementations may be employed depending on the application. For example, switches in at least some embodiments are implemented using transistors, diodes or MEMS (Micro Electro Mechanical Systems). Embodiments employing transistor switches may employ BJTs or field-effect transistors (FET), including metal-oxide-semiconductor field-effect transistors (MOSFET), metal-semiconductor field-effect transistors (MESFET) and high-electron-mobility transistors (HEMT). At least some embodiments of the present invention, especially those employing the asymmetrical LNA and PA circuits of FIG. 4A, may employ MESFETs or HEMTs.

To ease in illustration, the embodiments of FIGS. 4B and 6 show only a pair of parallel transistors. However, depending on the type of switch employed and the design frequency of the circuit three, four or another plurality of switches may be employed in the switch implementation.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

ACRONYMS LIST

AC Alternating Current
BJT Bipolar Junction Transistor
FET Field-Effect Transistor
HEMT High-Electron-Mobility Transistor
LNA Low Noise Amplifier
MEMS Micro Electro Mechanical Systems
MESFET Metal-Semiconductor Field-Effect Transistor
MOSFET Metal-Oxide-Semiconductor Field-Effect Transistor
PA Power Amplifier
SPDT Single-Pole Dual-Throw
SPMT Single-Pole Multi-Throw
SPST Single-Pole Single-Throw
SP4T Single-Pole Four-Throw

REFERENCE SIGNS LIST 100 transformer based switch
102 circuit
110 transformer
112 primary winding of the transformer
114 secondary winding of the transformer
120, 124 switch
130 single pole input port
131 output port
132 first output port
133 second output port
200 transformer based switch
202 Power Amplifier (PA) circuit
203 Low Noise Amplifier (LNA) circuit
210 transformer 212 primary winding of the transformer
214 secondary winding of the transformer
220 positive port switch
221 LNA circuit switch
224 negative port switch
230 single pole input port
231 output port
232 first output port
233 second output port
235 LNA output port
290 power amplifier
291 low noise amplifier
300 transformer based switch
302 Power Amplifier (PA) circuit
303 Low Noise Amplifier (LNA) circuit
310 transformer
312 primary winding of the transformer
314 secondary winding of the transformer
320 positive port switch
321 LNA circuit switch
324 negative port switch
330 single pole input port
331 output port
332 first output port
333 second output port
335 LNA output port
336 first port
337 second port
390 power amplifier
391 low noise amplifier
400 transformer based switch
402 Power Amplifier (PA) circuit
403 Low Noise Amplifier (LNA) circuit
410 transformer
412 primary winding of the transformer
414 secondary winding of the transformer
415 second transformer
417 primary winding of the second transformer
419 secondary winding of the second transformer
420, 422 positive port transistor
421, 423 LNA circuit transistor
424, 426 negative port transistor
430 single pole input port
432 first switch port
434 second switch port
435 third switch port
437 first output port
439 second output port
440, 442 impedance
450, 452 capacitor
455 capacitor
490 power amplifier
491 low noise amplifier
500 transformer based switch
502, 503 circuits
510, 515 transformer
512, 517 primary winding of the transformer
514, 519 secondary winding of the transformer
520, 521 switch
524, 525 switch
530 single pole input port
532, 537 first output port
533, 539 second output port
600 transformer based switch
602, 404 transformer based SPDT switch
610, 415 transformer
612, 417 primary winding 614, 419 secondary winding
620, 422 positive port transistor
621, 423 positive port transistor
624, 426 negative port transistor
625, 427 negative port transistor
630 single pole input port
632 first switch port
634 second switch port
636 third switch port
638 fourth switch port
633, 637 positive output port
635, 639 negative output port
641, 643 resistance
645, 647 resistance

The invention claimed is:

1. A Single-Pole Single-Throw (SPST) or Single-Pole Multi-Throw (SPMT) transformer based switch configured to be connected to a power amplifier (PA) and/or Low Noise Amplifier (LNA), said transformer based switch comprising:
  an input single pole port,
  a circuit comprising:
    a transformer having a primary and secondary winding, wherein one end of the primary winding is connected to the input single pole port and the other end is configured to be connected to a ground potential,
    at least one switch connected at one end to an end of the secondary winding of the transformer, the other end of the at least one switch being either:
      connected to the other end of the secondary winding, or configured to be connected to a ground potential, and
    an output port comprising a first output port connected to one end of the secondary winding of the transformer and a second output port connected to the other end of the secondary winding of the transformer, and
  a LNA circuit comprising:
    a quarter wavelength impedance connected at one end to the input single pole port,
    an LNA output port connected to the other end of the quarter wavelength impedance, and
    at least one LNA circuit switch connected at one end to the LNA output port, the other end being configured to be connected to a ground potential.

2. The transformer based switch of claim 1 wherein the circuit is a PA circuit, said PA circuit comprising:
  at least one positive port switch connected at one end to a positive end of the secondary winding of the transformer, the other end of the switch being configured to be connected to a ground potential, and
  at least one negative port switch connected at one end to a negative end of the secondary winding of the transformer, the other end of the switch being configured to be connected to a ground potential.

3. The transformer based switch of claim 1, wherein the switches are transistors, each transistor having a base connected to a switch port, said switch ports being configured to be connected to a switching potential.

4. The transformer based switch of claim 1, wherein the transformer is a linear transformer.

5. The transformer based switch of claim 3, wherein the switch ports connected to the circuit are configured to be connected to the same potential.

6. The transformer based switch of claim 3, wherein the switch ports connected to the LNA circuit are configured to be connected to the same potential.

7. The transformer based switch of claim 3, further comprising impedances connected between the base of at least one of the transistors and its respective switch port.

8. The transformer based switch of claim 3, further comprising capacitors configured to be connected between each of the switch ports and a ground potential.

9. The transformer based switch of claim 1, wherein the transformer is a center tap transformer.

10. The transformer based switch of claim 7, wherein the impedances are selected such that they are quarter wavelength impedances.

11. A Single-Pole Single-Throw (SPST) or Single-Pole Multi-Throw (SPMT) transformer based switch configured to be connected to a power amplifier (PA) and/or Low Noise Amplifier (LNA), said transformer based switch comprising:
   an input single pole port,
   a circuit comprising:
      a transformer having a primary and secondary winding, wherein one end of the primary winding is connected to the input single pole port and the other end is configured to be connected to a ground potential,
      at least one switch connected at one end to an end of the secondary winding of the transformer, the other end of the at least one switch being either:
         connected to the other end of the secondary winding, or configured to be connected to a ground potential, and
      an output port comprising a first output port connected to one end of the secondary winding of the transformer and a second output port connected to the other end of the secondary winding of the transformer
   a LNA circuit comprising:
      a second transformer having a primary and secondary winding, wherein one end of the primary winding of the second transformer is connected to the input single pole port and the other end is configured to be connected to a ground potential,
      an LNA output port comprising a first port connected to one end of the secondary winding of the second transformer and a second port connected to the other end of the secondary winding of the second transformer, and
      at least one LNA circuit switch connected at one end to first port of the LNA output port the other end being connected to the second port of the LNA output port.

12. The transformer based switch of claim 11 wherein the circuit is a PA circuit, said PA circuit comprising:
   at least one positive port switch connected at one end to a positive end of the secondary winding of the transformer, the other end of the switch being configured to be connected to a ground potential, and
   at least one negative port switch connected at one end to a negative end of the secondary winding of the transformer, the other end of the switch being configured to be connected to a ground potential.

13. The transformer based switch of claim 11, wherein the switches are transistors, preferably bipolar transistors, each transistor having a base connected to a switch port, said switch ports being configured to be connected to a switching potential.

14. The transformer based switch of claim 11, wherein the transformers are linear transformers.

15. The transformer based switch of claim 11, wherein the transformers are center tap transformers.

16. The transformer based switch of claim 13, wherein the switch ports connected to the circuit are configured to be connected to the same potential.

17. The transformer based switch of claim 13, wherein the switch ports connected to the LNA circuit are configured to be connected to the same potential.

18. The transformer based switch of claim 13, further comprising impedances connected between the base of at least one of the transistors and its respective switch port.

19. The transformer based switch of claim 18, wherein the impedances are selected such that they are quarter wavelength impedances.

20. The transformer based switch of claim 13, further comprising capacitors configured to be connected between each of the switch ports and a ground potential.

* * * * *